United States Patent [19]
Rossi et al.

[11] Patent Number: 4,799,119
[45] Date of Patent: Jan. 17, 1989

[54] FLEXIBLE CIRCUIT MAGNETIC CORE WINDING FOR A CORE MEMBER

[75] Inventors: Renato V. Rossi; Steven F. Starcke, both of Rochester, Minn.; David A. Swagel, Portland, Oreg.

[73] Assignee: International Business Machines Corporation, Armonk, N.Y.

[21] Appl. No.: 905,438

[22] Filed: Sep. 10, 1986

[51] Int. Cl.⁴ .............................................. G11B 5/17
[52] U.S. Cl. ..................................... 360/123; 360/127; 336/200
[58] Field of Search ....................... 336/200, 221–223, 336/232; 360/123, 127; 29/603

[56] References Cited

U.S. PATENT DOCUMENTS

| | | | |
|---|---|---|---|
| 3,254,856 | 6/1966 | Camras | 360/90 X |
| 3,479,738 | 11/1969 | Hanak | 360/127 X |
| 3,634,632 | 1/1972 | Watson | 360/123 |
| 3,697,911 | 10/1972 | Strauss | 336/200 X |
| 4,044,394 | 8/1977 | Hanazono et al. | 360/123 |
| 4,223,360 | 9/1980 | Sansom et al. | 360/123 |
| 4,308,513 | 12/1981 | Layton et al. | 336/200 |
| 4,315,291 | 2/1982 | Lazzari | 360/123 |
| 4,320,428 | 3/1982 | Somers | 360/123 |
| 4,581,598 | 4/1986 | York | 336/200 |
| 4,703,381 | 10/1987 | Shibata | 360/123 |

FOREIGN PATENT DOCUMENTS

| | | | |
|---|---|---|---|
| 58-151005 | 9/1983 | Japan | 336/200 |
| 61-177611 | 8/1986 | Japan | 29/603 |

OTHER PUBLICATIONS

Moreno, "Printed Circuit Coil", IBM Tech. Disc. Bull., vol. 12, No. 6, Nov. 1969.
Gonnella et al., Flexible Circuit Solenoid, IBM Technical Disclosure Bulletin, vol. 16, No. 9, p. 3008, Feb. 1974.

*Primary Examiner*—John H. Wolff
*Attorney, Agent, or Firm*—Curtis G. Rose

[57] ABSTRACT

A flexible circuit, sufficiently rigid for easy handling, is inserted once into the window of an integrally formed core member for a magnetic or ferrite head assembly. This flexible circuit contains a pattern of several parallel conductors. When the flexible circuit is bent around the core member, the ends of the parallel conductors come together. When respective ends are soldered together, a continuous multi-turn winding is created. Only one insertion is required, the flexible circuit is less prone to breakage, the electrical characteristics are repeatable, and the turns are inherently shielded and insulated from each other. More importantly, the flexible circuit is easily adapted to an automated assembly line.

9 Claims, 7 Drawing Sheets

(PLATING PROCESS)

APPLY PHOTORESIST TO POLYIMID WITH COPPER SEEDLAYER

PATTERN PHOTORESIST

PLATE COPPER

PLATE SOLDER

STRIP PHOTORESIST AND SEEDLAYER

APPLY PROTECTIVE LAYER (PRINT AND ETCH)

COPPER CLAD SUBSTRATE

APPLY AND PATTERN PHOTORESIST

ETCH COPPER

REMOVE PHOTORESIST

INSULATION LAYER

FLEXIBLE CIRCUIT MAGNETIC CORE WINDING FOR A CORE MEMBER

BACKGROUND OF THE INVENTION

This invention relates generally to flexible circuit magnetic core windings, particularly for core members, and more particularly integrally formed core members having a window such as those found on ferrite head assemblies, and to methods for assembling magnetic core windings around integrally formed core members, both by operators and automatically by mechanical means.

Magnetic core windings for core members are known in the art. In the manufacture of ferrite heads for reading fixed magnetic media, such as on a hard file, an operator typically threads wires through the window of the integrally formed core member on the ferrite head a given number of times. Due to the very small window in the core member and the small wires involved, the operator may need magnification to see what he or she is doing. This is a time consuming, tedious, error prone job that requires a highly skilled operator. The wires are subject to breakage, the operator can err by threading the wire too many or too few times. The wires can cross each other inside the core member, resulting in uneven magnetic characteristics.

Attempts have been made in the past to automate this process. Machines have been developed to assist the operator in counting the number of turns, and in guiding the wire to the core member. Although these machines have been useful to assist the operator, they have not been able to fully automate the process.

In addition, the lack of mechanical strength of the wire windings has resulted in lower reliability of the magnetic head assembly, since the wires are free to vibrate and wear.

SUMMARY OF THE INVENTION

This invention solves the problems inherent in the present system of core windings in integrally formed core members, e.g., on magnetic head assemblies, by eliminating the wire altogether. Instead, a flexible circuit, sufficiently rigid for easy handling, is simply inserted once into the window of the integrally formed core member. This flexible circuit contains a pattern of several parallel conductors. The flexible circuit is then bent around the core member so that the ends of the parallel conductors come together. When the respective ends are soldered together, a continuous multi-turn winding is created.

Therefore, only one insertion is required, the flexible circuit is less prone to breakage, the electrical characteristics are repeatable, and the turns are inherently shielded and insulated from each other. Most importantly, the flexible circuit is easily adapted to an automated assembly line.

Attempts have been made in the past to utilize thin film circuitry in conjunction with U-shaped or rod-like magnetic cores. However, none of these attempts involved threading the thin film circuit through the window of an integrally formed core member, folding the ends together and soldering respective ones to create a multi-turn winding. In addition, none of these attempts is capable to efficiently being used in an automated process in a magnetic head assembly.

Accordingly, it is an object of this invention to provide an improved apparatus and method for the manufacture of ferrite head assemblies.

It is another object of the invention to provide a flexible circuit magnetic core winding for a core member made up of a pattern of parallel conductors arranged such that a multi-turn winding is created when the ends of the circuit are brought together and connected.

It is another object of the invention to provide a method for an operator to easily assemble a flexible circuit magnetic core winding around a core member with only one insertion.

It is yet another object of the invention to provide a method for automatically assembling a flexible circuit magnetic core winding around a core member without the need of human intervention.

DESCRIPTION OF THE PREFERRED EMBODIMENT

Figure 1:
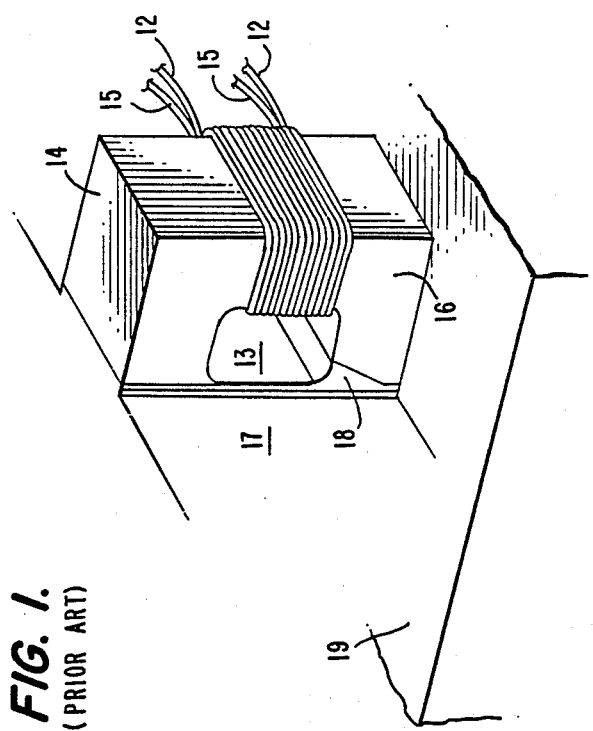
FIG. 1 is a core member with a conventional wire wound core.

Referring first to FIG. 1, the conventional wire wound coil around a core member for a ferrite head is shown. Wires 12 and 15 are inserted through window 13 of integrally formed core member 14 a specified number of times by an operator using a needle or hook type of device (not shown). Additional machinery (not shown) may be used to assist the operator to guide wires 12 and 15 to window 13 and to assist the operator in counting the number of turns. Since core member 14 and wires 12 and 15 are very small, magnification is usually needed to enable the operator to see what he or she is doing.

Integrally formed core member 14 is made up of ferrite leg portions 16 and 17, transducing gap portion 18, and window 13. When wires 12 and 15 are energized, a magnetic field is created by gap 18. This magnetic field is used to read and write to disk 19.

Figure 2:
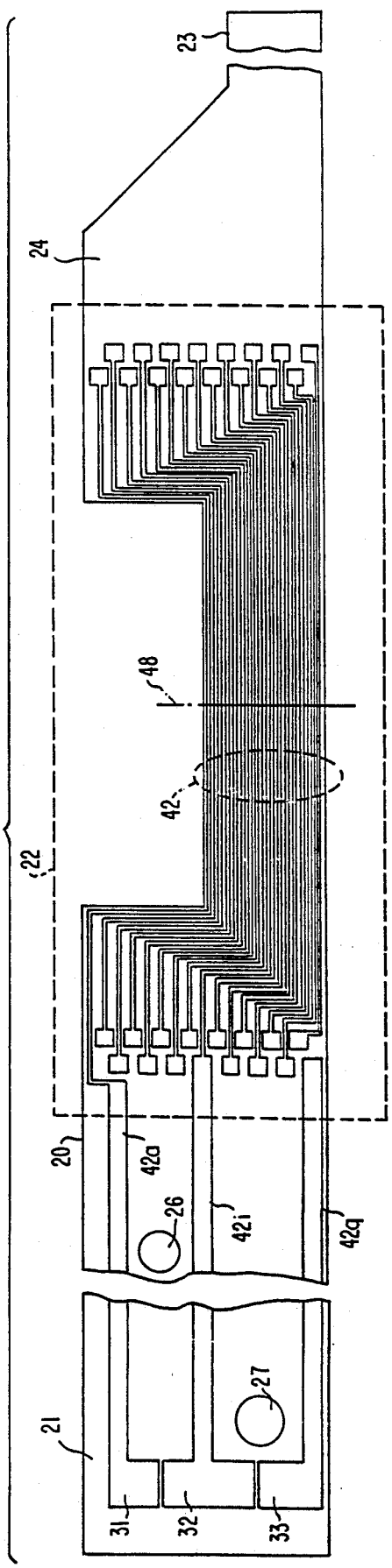
FIG. 2 is the flexible circuit magnetic core winding of the subject invention.

Referring now to FIG. 2, a flexible circuit magnetic core winding 20 is shown. Circuit 20 is constructed on an insulating flexible strip 21, preferably polyimide. Patterned onto strip 21 are winding area 22, leads 42a, 42i, 42q, and lead pads 31, 32, and 33 at one end of strip 21. The other end of strip 21 is removed from wider portion 24 down to an extended narrower tab portion 23, which is utilized in the assembly operation, as will be described below. Preferably, at least one edge of the area between tab portion 23 and wider portion 24 is angled as shown, to assist in the assembly operation.

Sensing holes 26 and 27 are used in the automated assembly process as described below.

Figure 3:
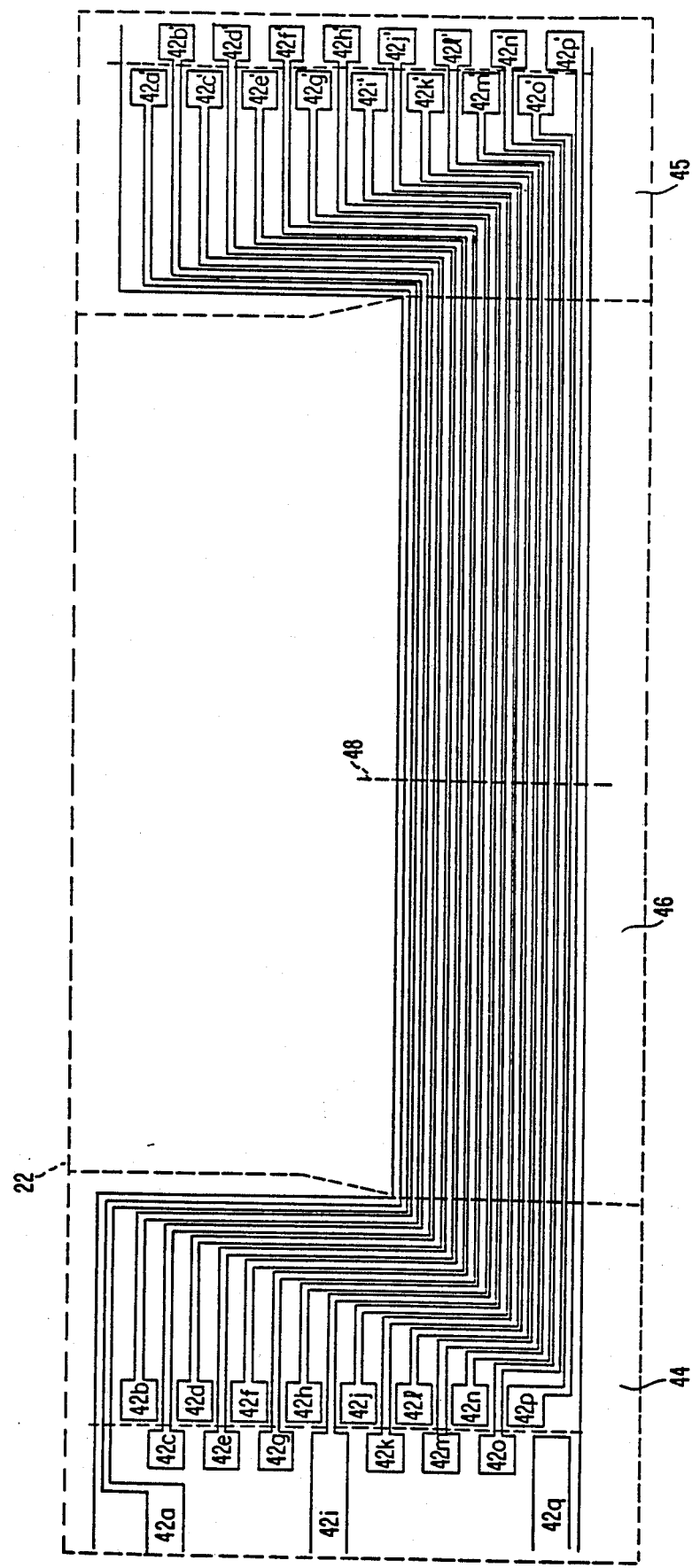
FIG. 3 shows the detail of the parallel conductors of the flexible circuit magnetic core winding of FIG. 2.

FIG. 3 shows winding area 22 in more detail. FIG. 3 shows the preferred embodiment of winding 42 with a center tap. In the preferred embodiment, circuit 20 is used for a ferrite head where a single winding with a center tap performs both read and write functions.

Referring again to FIG. 3, winding area 22 has end areas 44 and 45 and a middle section 46. End areas 44 and 45 each contain two rows of square connector pads 42a-42q. and 42a'-42p', respectively. The prime rotation is used to refer to pads to the right of center line 48. A first conductor line connects pad 42a to pad 42a', a second conductor line, adjacent to the first conductor line, connects pad 42b to pad 42b', and so on. Since the conductor lines originate at pads 42a-42q and terminate at pads 42a'-42p', pads 42a-42q are referred to as originating pads and pads 42a'-42p' are referred to as terminating pads Note that the conductor lines are substantially parallel to each other, particularly in the operative middle section 46. This parallel nature results in improved electrical characteristics of the winding.

When circuit 20 is folded about center point 48, pad 42b aligns with pad 42a'. Likewise, pad 42c aligns with pad 42', pad 42d aligns with pad 42c', and so on. In this manner, the parallel conductor lines form a multi-turn winding 42 when the respective aligned pads are connected. Pads 42a and 42q become the leads of winding 42. In the preferred embodiment of FIG. 3, one winding of sixteen turns is created. However, the number of windings and the number of turns in each winding can easily be varied for the specific application. For example, additional windings can be created by simply interposing other parallel conductors between the parallel conductors shown in FIG. 3. Of course, the arrangement of the square connector pads would have to be modified slightly, a feat well within the capabilities of one skilled in the art. One skilled in the art would also realize that multiple windings could also be created by stacking a plurality of circuits such as that shown in FIG. 3 on top of each other, either all embedded in the same flexible strip, on opposite sides of the same strip, or individually in a plurality of flexible strips.

Referring again to FIG. 3, as well as FIG. 2, line 42i is a center tap lead for the winding 42 in the preferred embodiment. Lines 42a, 42i, and 42q connect to lead pads 31, 32, and 33, respectively (FIG. 2), for connection to a read/write driver circuit (not shown). The read/write driver circuit energizes half of the winding (the first half of the parallel conductor lines via lead pads 31 and 32) for a write operation, and utilizes the entire winding (all parallel conductor lines via lead pads 31 and 33) for a read operation. The whole winding is utilized for a read operation because the signals coming from the disk are weaker than the write signals. Fewer turns are used for the write operation to limit the inductance of the winding for the fastest possible switching. The entire winding is not needed then because of the larger amount of current available from the driver circuit. Thus, the center tap is used to allow one winding to be used for both read and write operations.

One skilled in the art would realize that there are circumstances where a different pad other than the one in the center (here, 42i) would be connected to lead pad 32. For example, only one quarter of the winding might be needed for the write operation. In that case, pad 42e would be connected to lead pad 32.

Figure 4A:
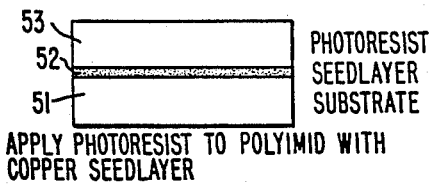
FIGS. 4A–4F show the preferred technique of plating for making the magnetic core winding of FIG. 2.
Figure 4B:
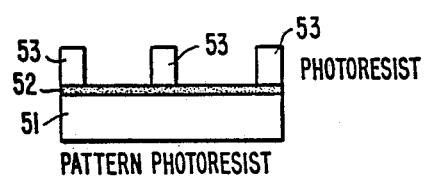
Figure 4C:
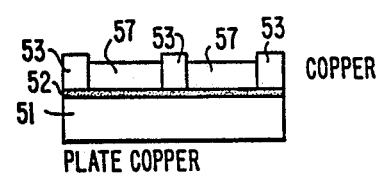
Figure 4D:
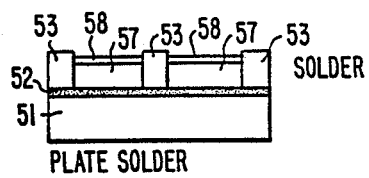
Figure 4E:
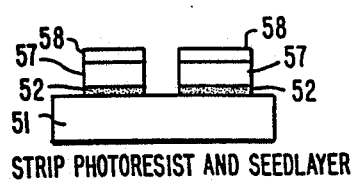
Figure 4F:
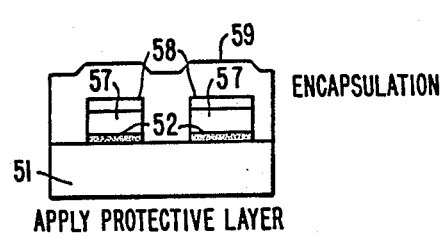

A preferred method of making circuit 20 by a plating technique is shown in FIGS. 4A-4F. FIG. 4A shows a side view of flexible media or substrate 51 thinly coated with copper seedlayer 52. Thick photoresist 53 is applied to thin copper seedlayer 52. FIG. 4B shows the result after ultraviolet light is shone through the desired pattern onto photoresist layer 53. After developing, copper seedlayer 52 is exposed where the ultraviolet light exposed removed photoresist 53 in a positive photoresist process. In FIG. 4C, copper pattern 57 is plated in the areas between existing photoresist 53. The plating operation can be either electro-plating or electroless plating. In FIG. 4D, a thin film of solder 58 is plated onto copper pattern 57. In FIG. 4E, remaining photoresist 53 and the then exposed seedlayer 52 are stripped away, thus leaving flexible media 51, unexposed seedlayer 52 under the desired copper pattern 57, and solder 58. In FIG. 4F, laminate 59 is added to copper pattern 57 in all areas except lead pads 31, 32, and 33 as shown in FIG. 2 and connector pads 42a-42q and 42a'-42p' as shown in FIG. 3. A plating method is preferred because the plating of the solder 58 simplifies the subsequent soldering step discussed later. Also, copper pattern 57 can be created with a higher degree of precision than an alternate method which will now be described.

Figure 5A:
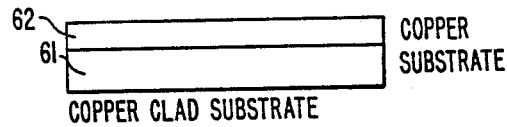
FIGS. 5A–5E show the alternate print and etch technique of making the flexible circuit magnetic core winding of FIG. 2.
Figure 5B:
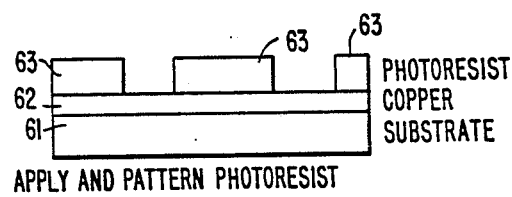
Figure 5C:
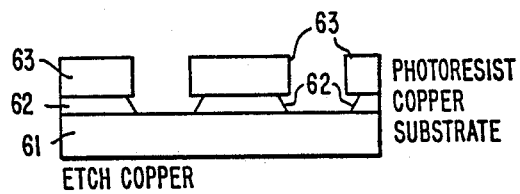
Figure 5D:
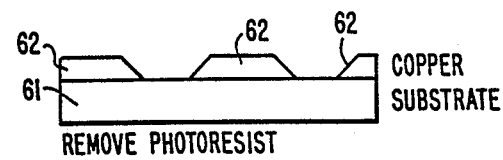
Figure 5E:
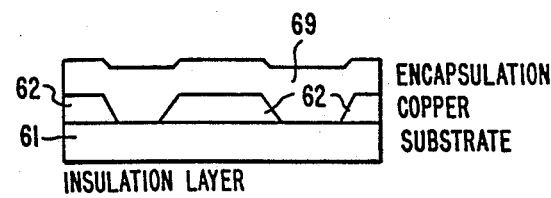

An alternate method of making circuit 20 is the print and etch technique as shown in FIGS. 5A-5F. FIG. 5A shows a side view of flexible media or substrate 61 coated with copper 62. Photoresist 63 is applied to copper coating 62. FIG. 5B shows the result after ultraviolet light is shone through the desired pattern onto photoresist layer 63. After developing, portions of copper 62 are uncovered where ultraviolet light removed photoresist 63 in a positive photoresist process. As shown in FIG. 5C, the uncovered copper portions are etched away, thus defining the winding pattern under the photoresist 63. However, the etching results in some undercutting of the copper, and the side walls of remaining portions 62 thus are somewhat slanted, as shown exaggerated. In FIG. 5D, the remaining photoresist 63 is stripped away, thus leaving flexible media 61 and copper portions 62 in the desired pattern as shown in FIG. 2. In FIG. 5E, laminate 69 is added to copper layer 62 in all areas except lead pads 31, 32, an 33 as shown in FIG. 2 and the connector pads in 42a-42q and 42'-42p' as shown in FIG. 3.

Figure 6A:
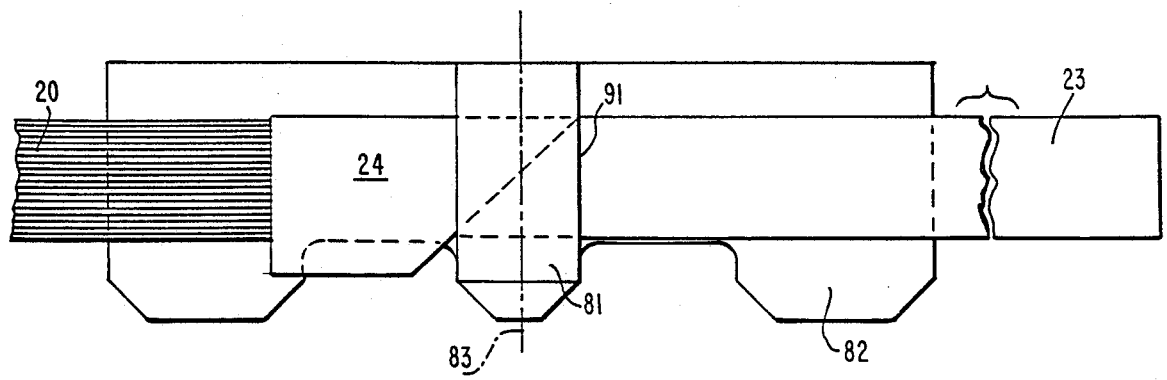
FIGS. 6A, 6B and 7 show the steps of manually assembling a flexible circuit magnetic core winding around a core member.
Figure 6B:
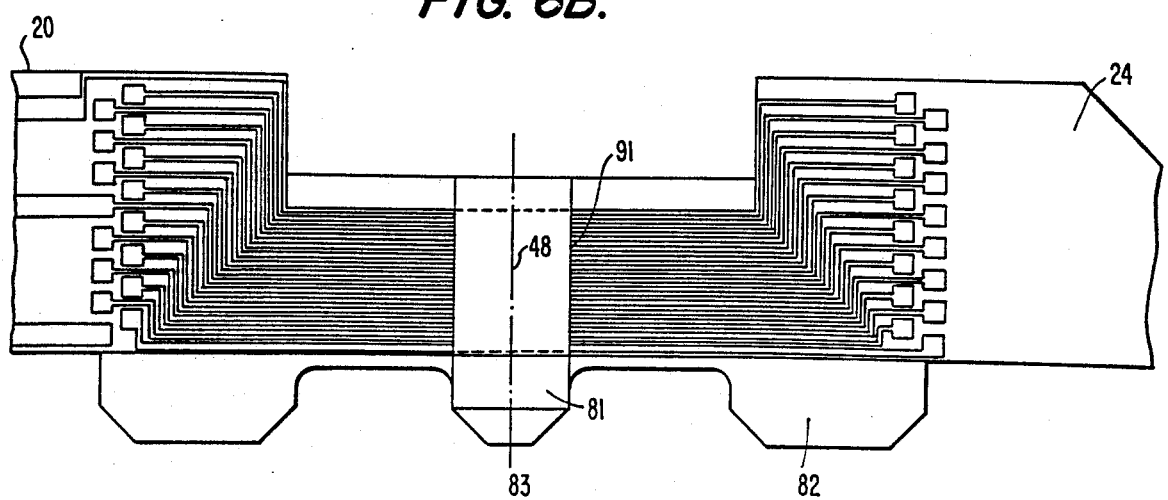
Figure 7:
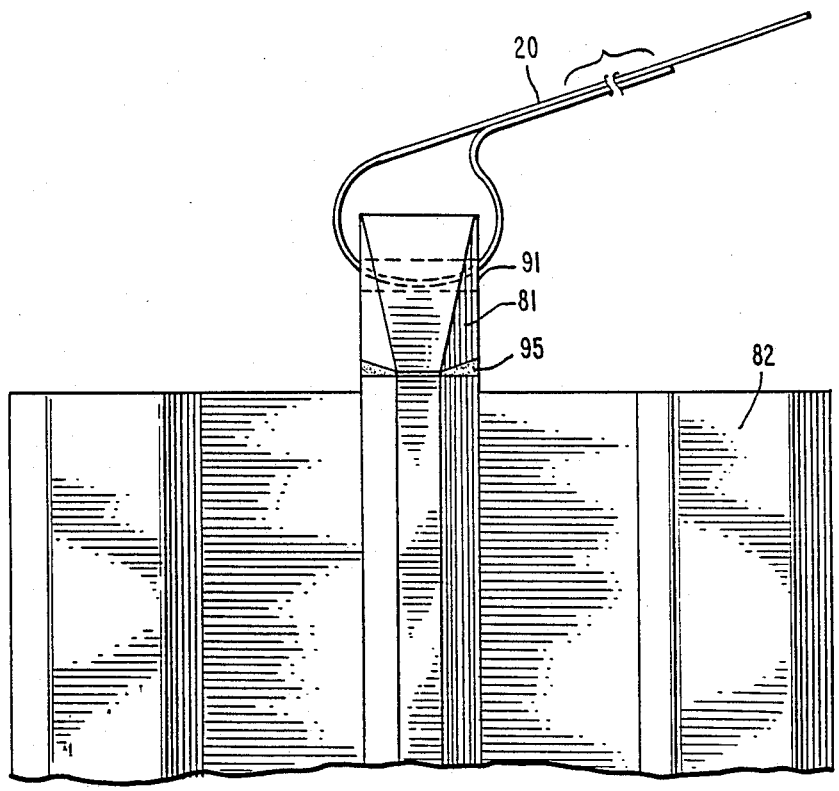

A preferred method for manually assembling the flexible magnetic core winding around a core member is shown in FIGS. 6A, 6B and 7. FIG. 6A is a top view of circuit 20 being inserted into window 91 of integrally formed core member 81, which is mounted perpendicularly to head assembly 82. Tab 23 (FIG. 2) is first inserted through window 91. Note that the width of tab 23 is preferably slightly less than the width of window 91. Wider portion 24 of circuit 20 (FIG. 2) is then curled over to fit through and drawn through window 91 of core member 81. After wider portion 24 is through window 91, circuit 20 snaps back flat. Middle section 46 (FIG. 3) is approximately the same width as window 91, so as to provide a friction fit within window 91 of core member 81.

End sections 44 and 45 are sufficiently wider than middle section 46 (FIG. 3) to provide enough area for soldering together the pads that make up winding 42. The connector pads of end areas 44 and 45 are larger than the conductor lines and placed in two rows to maximize the size of the pads and maximize the distance between the adjacent pads. In this manner, reliable repeatable solder connections can be made with no solder bridging between pads.

No tool is required to insert circuit 20 into window 91 of core member 81, as the circuit has sufficient rigidity to be threaded by itself. Circuit 20 is threaded through window 91 of core member 81 until circuit center point 48 (FIGS. 2 and 3) is aligned with core member center point 83, as shown in FIG. 6B.

Referring now to FIG. 7, a side view of circuit 20 inserted halfway through window 91 of core member 81 is shown. For illustrative purposes, the loop of circuit 20 is drawn larger than it would be in practice. Although not visible in this figure, Connector pads 42b–q in end area 44 are then aligned with connector pads 42a'–p', respectively, in end area 45.

With circuit 20 held by an aligning fixture (not shown) which compresses circuit 20 in end areas 44 and 45, the aligned connector pads are soldered together, thus making one complete multi-turn winding in the preferred embodiment. In the preferred embodiment, soldering is done by gas heat transfer, where a remote heating element (not shown) heats a quantity of inert gas which is then blown on the strip. Since the connector pads have already been coated with solder as described in the preferred embodiment plating process shown in FIG. 4, the solder melts when exposed to the hot gasses to produce the completed winding.

In addition to gas heat transfer soldering, there are many other soldering methods that could also be used. For example, laser soldering, solid heat transfer soldering, capacitance soldering, or ultrasonic soldering could be used as well.

Lead pads 31, 32, and 33 (FIG. 2) can now be routed for connection with a read/write driver circuit, as previously discussed. Lead pads 31–33 can be soldered as required, since the material of flexible media 21 is chosen to maintain integral stability well into the range of temperatures required for this operation.

In operation, the magnetic disk (not shown) would be positioned in FIG. 7 parallel to head 82, atop transducer gap 95, which in conjunction with circuit 20 and core member 81 create the magnetic and electric fields necessary to read and write data to and from the disk.

Figure 8:
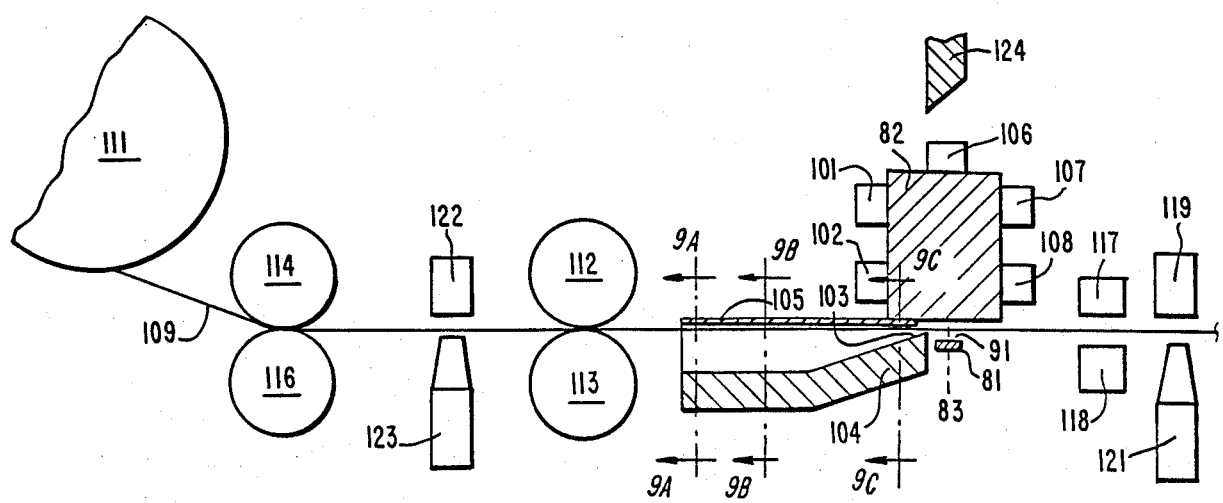
FIGS. 8–11 show the steps of assembling a flexible circuit magnetic core winding around a core member through automation without the need for human intervention.

FIGS. 8–11 describe a preferred method for automatically assembling the flexible magnetic core winding around a core member. FIG. 8 shows a diagrammatic side view of machinery used to perform this automation. Ferrite head assembly 82 is fed vertically, via an orienting hopper (not shown) and guides 101 and 102 until window 91 coincides with the opening 103 in strip guide 104. Head assembly 82 is then held into place by movable fingers 106, 107, and 108. Continuous circuit strip 109, which is made up of numerous circuits 20 (FIG. 2) with a perforation between each circuit, comes from roll 111 as a continuous ribbon, fed by wheel pairs 112, 113, 114, and 116.

Figure 9A:
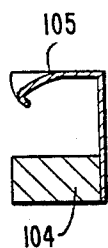
Figure 9B:
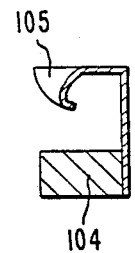
Figure 9C:
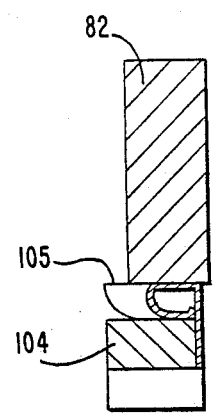

Strip 109 moves past wheels 112 and 113 to funnel 105 and strip guide 104. FIGS. 9A–9C show cross sections of funnel 105 and strip guide 104 taken along lines 9A–9A, 9B–9B, and 9C–9C, respectively. Funnel 105 gradually forces wider end portion 24 (FIG. 2) to curl in an increasingly tighter loop. FIG. 9C shows the funnel 105 and strip guide 104 coming together to enable strip 109 to be inserted into window 91 of integrally formed core member 81.

After strip 109 is sensed by sensors 119 and 121, fingers 117 and 118 close on strip 109, and wheels 112, 113, 114, and 116 become idle. Light emitting/sensing device pair sensors 122 and 123 detect sensing hole 26 in circuit 20 (FIG. 2), thus indicating that the conductor center line 48 (see FIGS. 2 and 3) is aligned with core member center line 83. Movable fingers 106–108 are then released. Head assembly 82 is now moved out to the right (by means not shown), with the strip, since center portion 46 of circuit 20 is friction fitted to the size of window 91.

Note that as strip 109 is moved to the right with head assembly 82, strip 109 is curled by funnel 105 and strip guide 104. This is done simply to pull the remaining strip portion through funnel 105 and strip guide 104, as the insertion through window 91 has already been performed.

Strip 109 continues to be moved to the right with head assembly 109 until sensors 122 and 123 sense sensing hole 27 (FIG. 2) of circuit 20, indicating that a perforation in strip 109 between two circuits 20 is positioned directly under strip cutter 104. When this occurs, movement of the strip stops and strip cutter 124 is advanced to cut strip 109 against strip guide 104. Strip cutter 124 is free to advance since finger 106 is now removed from the path traveled by cutter 124. As a result of the above operation, circuit 20 is centered in window 91 of core member 81.

Note that sensor 123 is actually two adjacent sensors used to sense displaced sensor holes 26 and 27. Also, one skilled in the art would quickly realize that sensors 122 and 123 could operative reflectively by detecting marks in the strip. Sensing holes 26 and 27 would be then replaced with detecting marks printed on the surface of strip 21. OF course, sensors 122 and 123 would have to be on the same side of the strip in this case.

Figure 10:
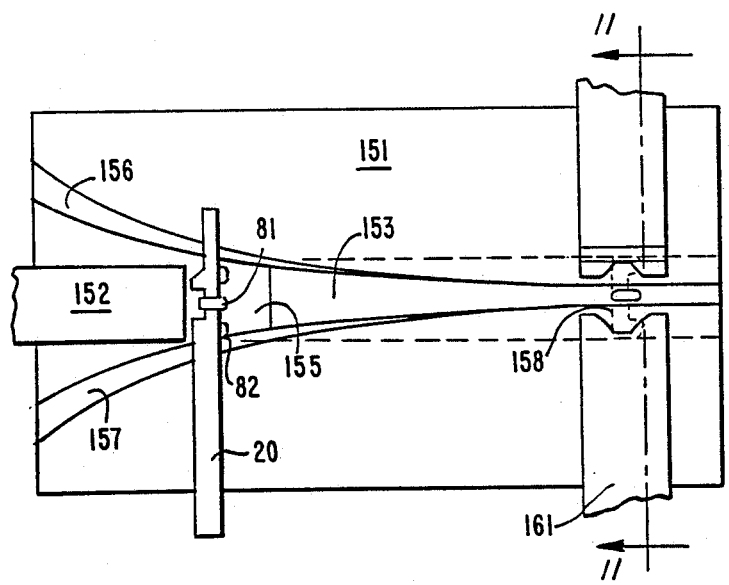

FIG. 10 shows a top view of the machinery used to close circuit 20 around core member 81 and solder the respective pads together. Head assembly 82 (with inserted circuit 20) is placed in recessed portion 155 of fixture 151 at a starting location between plungers 152 and 153, shown in their starting positions. Races 156 and 157 are outside recessed portion 155 of fixture 151. Plunger 152 moves from left to right, moving head assembly 82 against plunger 153 and then continues until head assembly 82 has reached ending location 158.

Figure 11:
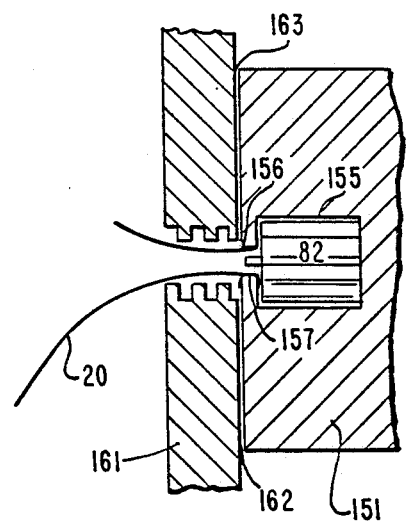

FIG. 11 is a cross-sectional view of FIG. 10 taken along line 11—11, showing head assembly 82 (with inserted circuit 20) in ending location 158. Once head assembly 82 is in ending location 158, fixture 161 can close, thereby aligning the connector pads of circuit 20 for soldering, as discussed previously. Soldering can be performed using any of the methods explained previously (except capacitance soldering) through apertures 162 and 163. A different fixture is required for capacitance soldering, where the aligning portion of the fixture is separate from the soldering portion, and the two halves of the soldering fixture are electrically insulated.

After the soldering is complete, fixture 161 opens and plunger 152 is returned from right to left, as plunger 153 moves head assembly 82 out of fixture 151.

While we have illustrated and described the preferred and alternate embodiments of our invention, it is understood that we do not limit ourselves to the precise constructions disclosed herein. We expressly reserve the right to all changes and modifications coming within the scope of the invention as defined in the appended claims.

We claim:

1. A flexible magnetic core winding for an integrally formed core member having a window, comprising:

a strip of flexible insulating material;

a plurality of substantially parallel conductors having connector pads wherein said connector pads are formed in a plurality of rows to maximize the size of said connector pads and the distance between said connector pad;

a plurality of leads on said strip attached to said connector pads;

a plurality of lead pads on said strip attached to said plurality of leads, wherein said lead pads are substantially larger than said connector pads;

wherein said connector pads are originating pads add terminating pads each of said terminating pads contacting the originating pad at the next adjacent conductor to form a multi-turn winding when the ends of said strip are brought together and said contacted pads are electrically connected.

2. The flexible circuit magnetic core winding of claim 1, wherein one of said leads is a center tap lead.

3. The flexible circuit magnetic core winding of claim 1, further comprising a plurality of additional parallel conductors between said parallel conductors for creating a plurality of windings.

4. The flexible circuit magnetic core winding of claim 1, wherein said strip has a first end, a middle section, and a second and, said first end and said second end being substantially wider than said middle section.

5. The flexible circuit magnetic core winding of claim 4, wherein said second end of said strip further comprises a narrow tab for easy insertion in said core member.

6. The flexible circuit magnetic core winding of claim 1, wherein:

said conductors are embedded in said strip and all of said connector pads are at one surface of said strip.

7. The flexible circuit magnetic core winding of claim 1, wherein: said leads are substantially longer than said conductors.

8. A ferrite head assembly for reading and writing to fixed magnetic media comprising:

an integrally formed core member including a transducing gap and ferrite leg portions forming a window;

a strip of flexible insulating material;

a plurality of conductors having originating pads and terminating pads;

a plurality of leads on said strip attached to said originating pads;

a plurality of lead pads on said strip attached to said plurality of leads, wherein said lead pads are substantially larger than said originating pads and said terminating pads;

each of said terminating pads contacting the originating pad of the next adjacent conductor to form a multi-turn winding around said core member when said strip is inserted through said window of said core member and the ends of said strip are brought together and said contacted pads are electrically connected;

wherein said originating and terminating pads are formed in a plurality of rows to maximize the size of said pads and the distance between said pads.

9. The flexible circuit magnetic core winding of claim 8 wherein:

said leads are substantially longer than said conductors.

* * * * *